United States Patent
Ando et al.

(10) Patent No.: US 10,332,957 B2
(45) Date of Patent: Jun. 25, 2019

(54) STACKED CAPACITOR WITH SYMMETRIC LEAKAGE AND BREAK-DOWN BEHAVIORS

(71) Applicant: International Business Machines Corporation, Armonk, NY (US)

(72) Inventors: Takashi Ando, Tuckahoe, NY (US); Eduard A. Cartier, New York, NY (US); Vijay Narayanan, New York, NY (US); Adam M. Pyzyna, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 179 days.

(21) Appl. No.: 15/198,800

(22) Filed: Jun. 30, 2016

(65) Prior Publication Data

US 2018/0006108 A1    Jan. 4, 2018

(51) Int. Cl.
*H01L 49/02* (2006.01)

(52) U.S. Cl.
CPC ..................... *H01L 28/75* (2013.01)

(58) Field of Classification Search
CPC ............... H01L 28/40; H01L 21/31645; H01L 21/02178; H01L 21/022; H01L 21/3142; H01L 21/31616; H01L 28/91; H01L 45/146; H01L 21/02181; H01L 21/02194; H01L 28/60; H01L 28/56; H01L 28/75; H01L 21/02488; H01L 27/1259; H01L 29/92; H01L 27/0805; H01L 29/517
See application file for complete search history.

(56) References Cited

U.S. PATENT DOCUMENTS

| | | | |
|---|---|---|---|
| 7,623,338 B2 | 11/2009 | Won | |
| 9,224,801 B2 | 12/2015 | Cheng et al. | |
| 2007/0026625 A1 | 2/2007 | Chung et al. | |
| 2007/0102742 A1* | 5/2007 | Kil | H01L 21/02178 257/295 |
| 2011/0278698 A1* | 11/2011 | Choi | H01L 27/10852 257/532 |
| 2012/0091418 A1* | 4/2012 | Chen | H01L 45/08 257/4 |
| 2013/0126821 A1* | 5/2013 | Sekar | H01L 45/145 257/4 |
| 2015/0357401 A1 | 12/2015 | Pelloquin et al. | |

FOREIGN PATENT DOCUMENTS

| | | |
|---|---|---|
| CN | 1851919 A | 10/2006 |
| KR | 1020090128911 A | 12/2009 |
| KR | 100975756 B1 | 8/2010 |

* cited by examiner

*Primary Examiner* — Ratisha Mehta
(74) *Attorney, Agent, or Firm* — Cantor Colburn LLP; Vazken Alexanian

(57) ABSTRACT

A layered structure including a tri-stack dielectric layer and a plurality of metal layers insulated from each other by the tri-stack dielectric layer. The plurality of metal layers includes a set of first-type metal layers and a set of second-type metal layers. An adjacent pair of the plurality of metal layers includes a first-type metal layer and a second-type metal layer. The tri-stack dielectric layer includes a first tri-stack layer including $Al_2O_3$, a second tri-stack layer including $HfO_2$; and a third tri-stack layer including $Al_2O_3$.

10 Claims, 6 Drawing Sheets

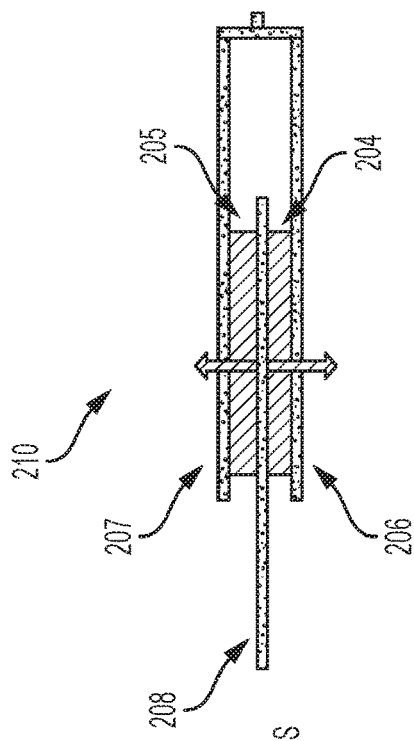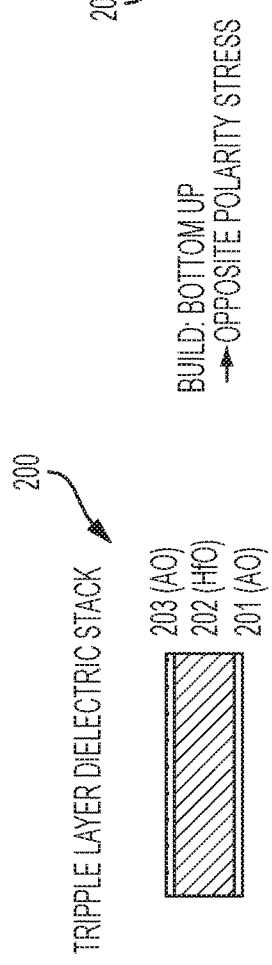

STACKED CAPACITOR WITH SYMMETRIC LEAKAGE AND BREAK-DOWN BEHAVIORS

BACKGROUND

The present invention generally relates to the structure and fabrication of semiconductor devices, and more specifically to the structure and fabrication of stacked capacitors having symmetric leakage and break-down behaviors.

High capacity capacitors have been used in the semiconductor industry for years, in applications such as dynamic random-access memory (DRAM) storage, protection from high energy environments, decoupling capacitors and many more. As integrated circuits continue to become more densely built, small and powerful decoupling capacitors are needed for optimal system performance.

SUMMARY

Embodiments provide a layered structure including a tri-stack dielectric layer and a plurality of metal layers insulated from each other by the tri-stack dielectric layer. The plurality of metal layers includes a set of first-type metal layers and a set of second-type metal layers. An adjacent pair of the plurality of metal layers includes a first-type metal layer and a second-type metal layer. The tri-stack dielectric layer includes a first tri-stack layer including $Al_2O_3$, a second tri-stack layer including $HfO_2$; and a third tri-stack layer including $Al_2O_3$.

Other embodiments provide a stacked planar capacitor including a first metal layer and a first tri-stack dielectric layer disposed over the first metal layer. A second metal layer is disposed over the first tri-stack dielectric layer. A second tri-stack dielectric layer is disposed over the second metal layer. A third metal layer is disposed over the second tri-stack dielectric layer. The tri-stack dielectric layer includes a first tri-stack layer including $Al_2O_3$, a second tri-stack layer including $HfO_2$, and a third tri-stack layer including $Al_2O_3$.

Other embodiments provide a method to form a planar capacitor. According to the method, a first metal layer is provided. A first tri-stack dielectric layer is disposed over the first metal layer. A second metal layer is disposed over the first tri-stack dielectric layer. A second tri-stack dielectric layer is disposed over the second metal layer. A third metal layer is disposed over the second tri-stack dielectric layer. The tri-stack dielectric layer includes a first tri-stack layer including $Al_2O_3$, a second tri-stack layer including $HfO_2$; and a third tri-stack layer including $Al_2O_3$.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 illustrates a triple layer dielectric stack in accordance with embodiments of the present invention;

FIG. 2 illustrates a stacked planar capacitor in accordance with other embodiments of the present invention;

Reference is made below to the above-described drawings, which are not drawn to scale for ease of understanding, wherein the same reference numbers used throughout different figures designate the same or similar components.

DETAILED DESCRIPTION

Figure 3:
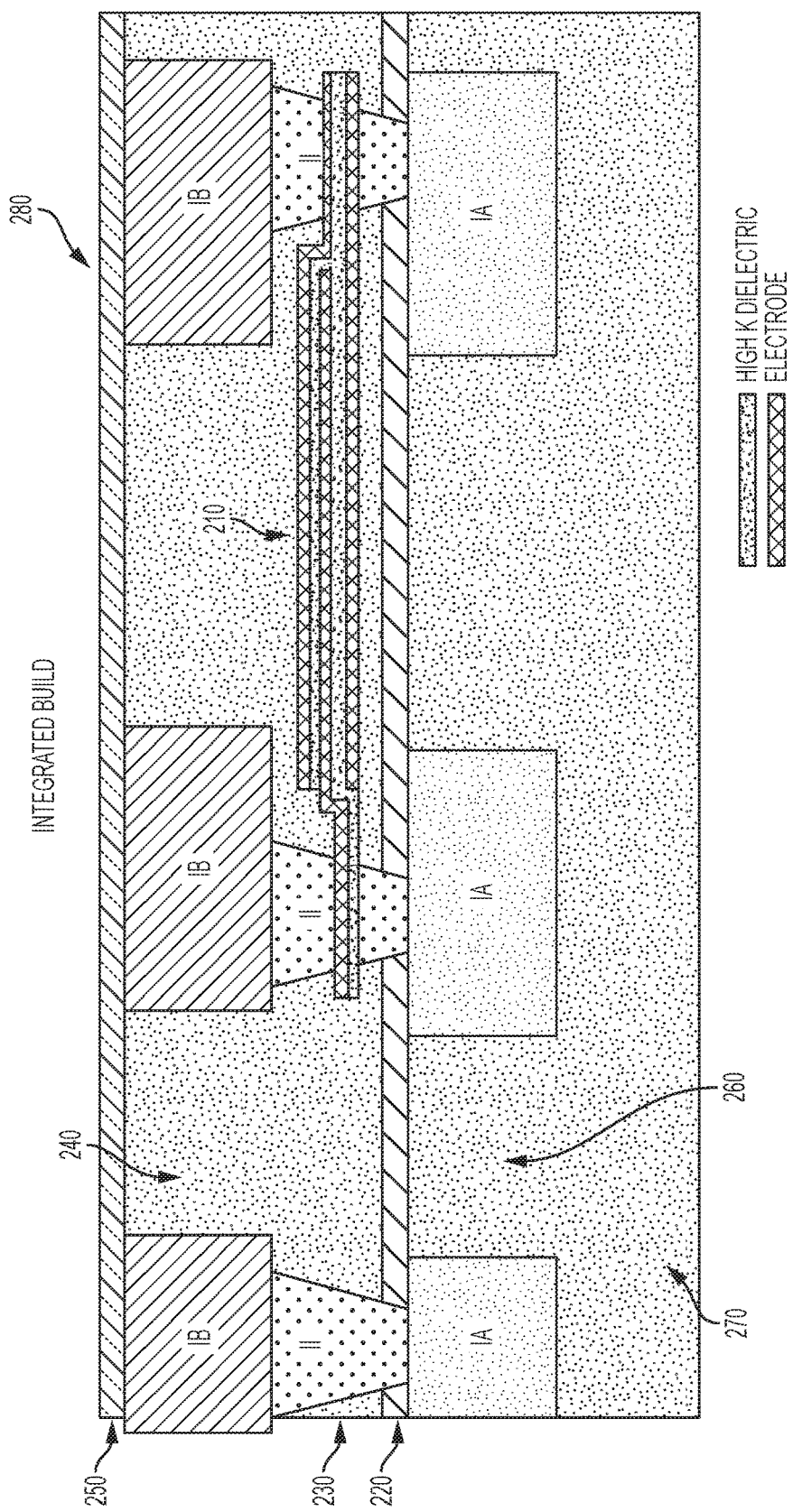
FIG. 3 illustrates an integrated build of the stacked planar capacitor in accordance with still other embodiments of the present invention.

Various embodiments of the present invention are described herein with reference to the related drawings. Alternative embodiments may be devised without departing from the scope of this invention. It is noted that various connections and positional relationships (e.g., over, below, adjacent, etc.) are set forth between elements in the following description and in the drawings. These connections and/or positional relationships, unless specified otherwise, may be direct or indirect, and the present invention is not intended to be limiting in this respect. Accordingly, a coupling of entities may refer to either a direct or an indirect coupling, and a positional relationship between entities may be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present invention will now be provided. Although specific fabrication operations used in implementing one or more embodiments of the present invention may be individually known, the described combination of operations and/or resulting structures of the present invention are unique. Thus, the unique combination of the operations described in connection with the present invention utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying invention will be apparent to those skilled in the art from this description.

As previously noted herein, high capacity capacitors have been used in the semiconductor industry for years, in applications such as dynamic random-access memory (DRAM) storage, protection from high energy environments, decoupling capacitors and many more. As integrated circuits continue to become more densely built, small and powerful decoupling capacitors are needed for optimal system performance.

Techniques employed to obtain sufficiently high capacitance density per area include providing a three-dimensional (3-D) capacitor structure, three-electrode stacked capacitor structures (for decoupling capacitors), and increased K values for the capacitor's high-K insulator. However, because the electrical bias polarities are opposite for the bottom capacitor and the top capacitor in three-electrode stacked capacitor designs, the high-K thickness needs to be high to pass reliability specs for the weaker side. This results in lower capacitance density.

Embodiments of the present invention provide structures and fabrication methods for a stacked capacitor having symmetric leakage and break-down behaviors. More specifically, embodiments of the present invention provide a tri-layer stack as the dielectric insulators in a 3-electrode (i.e., "stacked") capacitor. In embodiments, the described tri-layer stack includes a first tri-stack layer including $Al_2O_3$, a second tri-stack layer including $HfO_2$, and a third tri-stack layer including $Al_2O_3$. The layers of the tri-layer stack are chosen such that the dielectric break-down behavior is symmetric for the biasing polarity of the bottom electrode and the biasing polarity of the top electrode in a three-electrode stacked capacitor design, thus enabling high-K thickness scaling.

Turning now to a more detailed description of various embodiments of the present invention, FIG. 1 illustrates a triple layer dielectric stack 200. The triple layer dielectric stack 200 includes a first tri-stack layer 201 including $Al_2O_3$ (AO), a second tri-stack layer 202 including $HfO_2$ (HfO); and a third tri-stack layer 203 including $Al_2O_3$ (AO). As shown in FIG. 1, the second tri-stack layer 202 including $HfO_2$ can be disposed over the first tri-stack layer 201 including $Al_2O_3$, and the third tri-stack layer 203 including $Al_2O_3$ can be disposed over the second tri-stack layer 202 including $HfO_2$. In some embodiments, the triple layer dielectric stack 200 is a high-K dielectric having dielectric constant greater than about 2.5, for example, about 15 to about 20, or even greater than about 20.

The triple layer dielectric stack $Al_2O_3/HfO_2/Al_2O_3$ 200 can have a thickness of about 5 Å to about 100 Å, in some embodiments, from about 10 Å to about 80 Å, and in some other embodiments, about 15 Å to about 50 Å. The thickness of each of first tri-stack layer 201 including $Al_2O_3$ and the third tri-stack layer 203 in the tri-stack layer of $Al_2O_3/HfO_2/Al_2O_3$ 200 can be the same or different and can be from about 3 Å to about 10 Å. The thickness of the second tri-stack layer 202 including $HfO_2$ in the tri-stack layer of $Al_2O_3/HfO_2/Al_2O_3$ 200 can be from about 10 Å to about 60 Å. Deviation of +/−20% is desirable, but can be more relaxed as long as no substantially weak spots exist in the dielectric film which could cause premature breakdown in operation.

The triple layer dielectric stack 200 can be included in a layered structure between two metal layers. Thus, in some embodiments of the present invention provided is a layered structure including a tri-stack dielectric layer and a plurality of metal layers insulated from each other by the tri-stack dielectric layer. An adjacent pair of the plurality of metal layers can include a first-type metal layer and a second-type metal layer, which can be the same or different. Each of the first-type metal layer and the second-type metal layer can be fabricated from TiN. Reference throughout the following description to 'metal' refers to any conductive material.

The thickness of the metal is determined by structural integrity of the metal and the conductivity requirement as well as the number of layers desired. Typical thickness ranges between about 50 Å and about 500 Å with about 100 Å to about 200 Å being a desirable thickness. The metal layers can be deposited with typical conformal thin film deposition techniques. Deviation of +/−50% is desirable but the metal layers do not necessarily need to be free of thin spots.

The sequence of tri-stack dielectric layer, first metal, tri-stack dielectric layer, and second metal can be repeated numerous times. For example, repeating n=four times would produce a structure with n+1=5 first metal layers interleaved with 5 second metal layers, with a tri-stack dielectric layer $Al_2O_3/HfO_2/Al_2O_3$ separating adjacent metal layers. The stack can be completed, after repeating the first four layers as desired (or not repeating even once), by depositing a final dielectric layer. Such a final stack would have an equal number of the first and second metal layers. Alternatively, after forming just the first four layers, or after repeating the four-layer sequence 'n' times, the stack can be completed by depositing another tri-stack dielectric layer $Al_2O_3/HfO_2/Al_2O_3$ layer, then a final first metal layer. The stack in such an embodiment would have 1+n second metal layers and would have 2+n first metal layers.

In some other embodiments, the layered structure can further include a first electrode contacting each second-type metal layer and insulated from each first-type metal layer, a second electrode contacting each first-type metal layer and insulated from each second-type metal layer, and a dielectric material separating and insulating the first electrode from each first-type metal layer and separating and insulating the second electrode from each second-type metal layer.

In still some other embodiments, the plurality of metal layers can include a stack of metal layers including three metal layers (shown in FIG. 2). According to FIG. 2, a stacked planar capacitor 210 can include a first metal layer 206, a first tri-stack dielectric layer 204 disposed over the first metal layer 206, a second metal layer 208 disposed over the first tri-stack dielectric layer 204, a second tri-stack dielectric layer 205 disposed over the second metal layer 208, and a third metal layer 207 disposed over the second tri-stack dielectric layer 205.

FIG. 3 shows illustrates an integrated build 280 prepared according to embodiments of the present invention. Referring to FIG. 3, the triple layer dielectric stack 200 is disposed between a first metallization layer IA and a second metallization layer IB connected via a contact II. In some embodiments, at least one of the first interlayer dielectric, 220 a second interlayer dielectric 230, a third interlayer dielectric 240, a fourth interlayer dielectric 250, a fifth interlayer dielectric 260, and a sixth interlayer dielectric 270 can be coated.

Further described herein is a method to form a planar capacitor. According to the method, a first metal layer is provided. A first tri-stack dielectric layer is disposed over the first metal layer. A second metal layer is disposed over the first tri-stack dielectric layer. A second tri-stack dielectric layer is disposed over the second metal layer. A third metal layer is disposed over the second tri-stack dielectric layer. The tri-stack dielectric layer includes a first tri-stack layer including $Al_2O_3$, a second tri-stack layer including $HfO_2$; and a third tri-stack layer including $Al_2O_3$.

Figure 4:
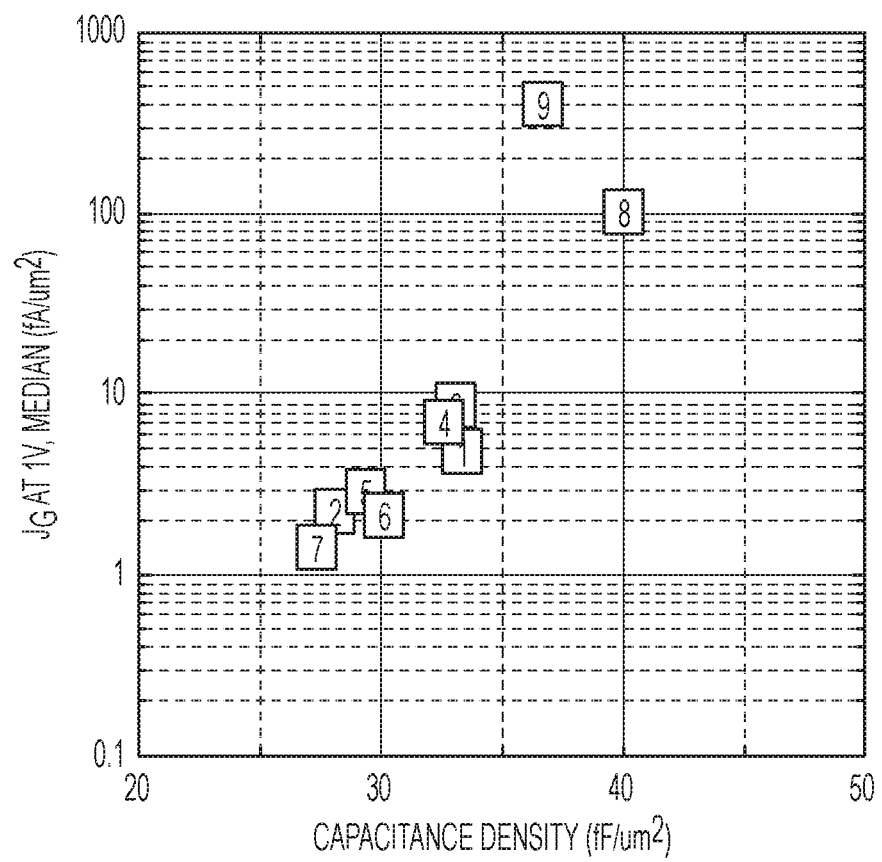
FIG. 4 is a graph of leakage current density ($J_G$) at 1V ($fA/um^2$) versus capacitance density ($fF/um^2$) illustrating competitive $J_G$-capacitance density relationship.
Figure 5:
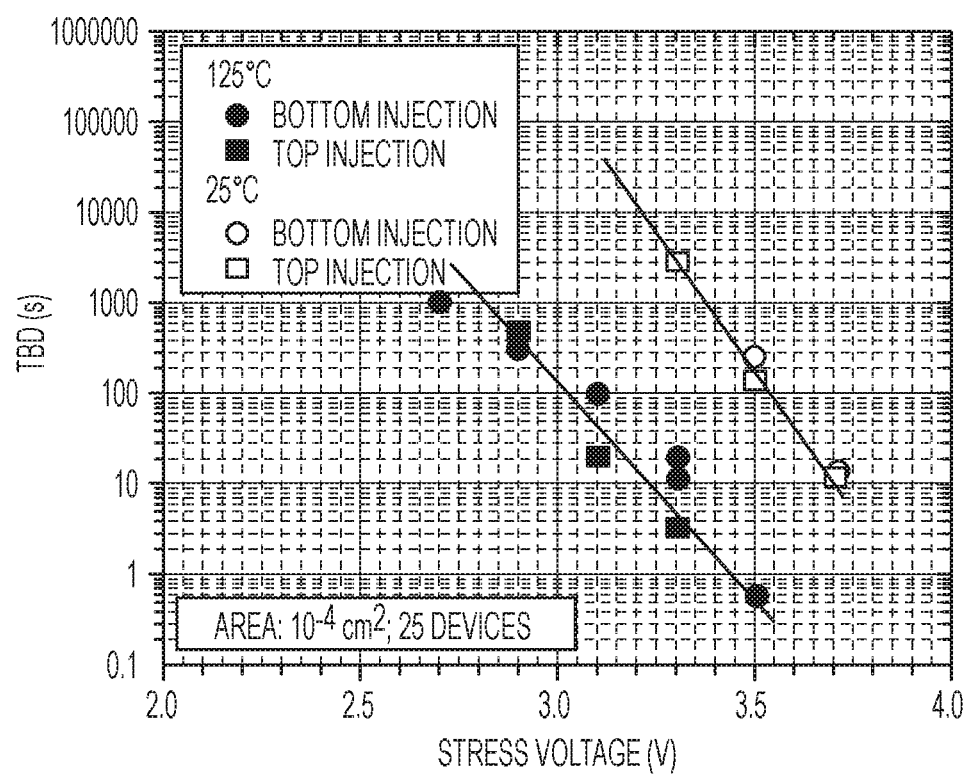
FIG. 5 is a graph of time to breakdown (TBD, s) versus stress voltage (V) illustrating symmetric breakdown behaviors for both bias polarities (bottom and top injections)
Figure 6A:
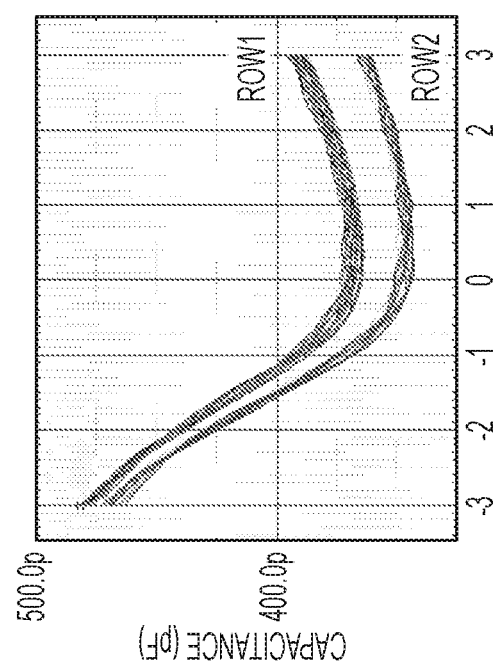
FIG. 6A is a graph of capacitance (pF) versus gate bias (V) for the $HfO_2$ dielectric layer illustrating asymmetric characteristics.
Figure 6B:
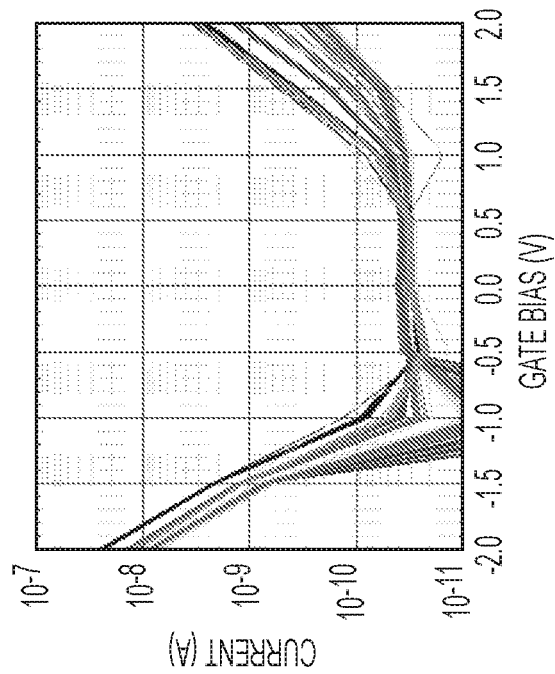
FIG. 6B is a graph of leakage current (A) versus gate bias (V) for the $HfO_2$ dielectric layer illustrating asymmetric characteristics.
Figures 7A, 7B:
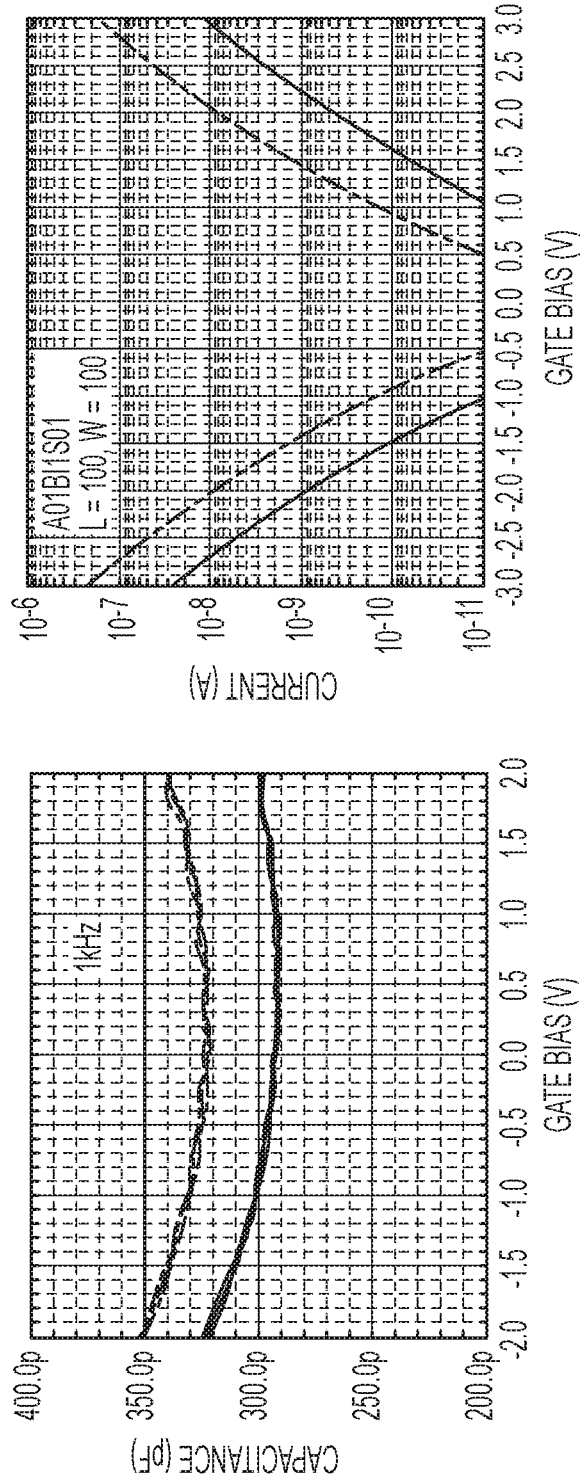
FIG. 7A is a graph of capacitance (pF) versus gate bias (V) for the tri-stack $Al_2O_3/HfO_2/Al_2O_3$ dielectric layer illustrating symmetric characteristics.
FIG. 7B is a graph of current (A) versus gate bias (V) for the tri-stack $Al_2O_3/HfO_2/Al_2O_3$ dielectric layer illustrating symmetric characteristics.

A very aggressive Capacitance-$J_G$ (EOT 11.5 Å) with symmetric TDDB behaviors (i.e., identical trend for top and bottom injections) was achieved with the tri-stack $Al_2O_3/HfO_2/Al_2O_3$ dielectric layer as shown in FIG. 4 and FIG. 5, respectively. A conventional $HfO_2$ dielectric layer shows asymmetric capacitance versus gate bias (FIG. 6A) and leakage current versus gate bias (FIG. 6B) relationships. On the other hand, the tri-stack $Al_2O_3/HfO_2/Al_2O_3$ dielectric layer shows symmetric capacitance versus gate bias (FIG. 7A) and leakage current versus gate bias (FIG. 7B) relationships. This enables application to multiple electrodes (>2) structures with opposing biasing polarities for each dielectric layer.

A feature of the present invention is a tri-stack $Al_2O_3/HfO_2/Al_2O_3$ dielectric layer (shown as 200 in FIG. 1, and 205 and 206 in FIG. 2), which is used for the stacked capacitor discrete component. The described tri-stack makes the dielectric break-down behavior symmetric for both biasing polarities, thus enabling High-K thickness scaling. The inventors unexpectedly found that three distinctive layers of $Al_2O_3/HfO_2/Al_2O_3$ offer clear advantage over an intermixed HfAlO layer. An intermixed $Al_2O_3$ cap layer is practiced to stabilize the higher-K phase of $HfO_2$. A top $Al_2O_3$ cap layer is also practiced for Vt-tuning for gate dielectrics.

Although the invention has been shown and described with respect to a certain embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the described structure which performs the function in the herein illustrated exemplary embodiments of the invention. In addition, while a particular feature of the invention may have been described with respect to only one of several embodiments, such feature may be combined with one or more features of the other embodiments as may be desired and advantageous for any given or particular application.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The invention claimed is:

1. A stacked planar capacitor, comprising:
a first metal layer;
a first tri-stack dielectric layer disposed on a surface of the first metal layer;
a second metal layer disposed on a surface of the first tri-stack dielectric layer;
a second tri-stack dielectric layer disposed on a surface of the second metal layer; and
a third metal layer disposed on a surface of the second tri-stack dielectric layer;
wherein each of the first tri-stack dielectric layer and the second tri-stack dielectric layer comprises:
a first tri-stack layer comprising $Al_2O_3$;
a second tri-stack layer comprising $HfO_2$; and
a third tri-stack layer comprising $Al_2O_3$;
wherein the first metal layer, the first tri-stack dielectric layer, and the second metal layer define a first capacitor comprising a first electrical bias polarity;
wherein the second metal layer, the second tri-stack dielectric layer, and the third metal layer define a second capacitor comprising a second electrical bias polarity, the second electrical bias polarity opposite the first electrical bias polarity; and
wherein a dielectric break-down behavior is symmetric for both biasing polarities.

2. The capacitor of claim 1, wherein a thickness of each of the first metal layer, the second metal layer, and the third metal layer is about 200 Angstroms to about 400 Angstroms.

3. The capacitor of claim 1, wherein each of the first metal layer, the second metal layer, and the third metal layer comprises TiN.

4. The capacitor of claim 1, wherein a thickness of each of the first tri-stack layer and the second tri-stack layer is about 5 Angstroms to about 100 Angstroms.

5. The capacitor of claim 1, wherein a thickness of each of the first tri-stack layer and the second tri-stack layer is about 10 Angstroms to about 80 Angstroms.

6. The capacitor of claim 1, wherein a thickness of each of the first tri-stack layer and the second tri-stack layer is about 15 Angstroms to about 50 Angstroms.

7. The capacitor of claim 1,
wherein the second tri-stack layer comprising $HfO_2$ is disposed over the first tri-stack layer comprising $Al_2O_3$, and
wherein the third tri-stack layer comprising $Al_2O_3$ is disposed over the second tri-stack layer comprising $HfO_2$.

8. The capacitor of claim 7,
wherein a thickness of each of the first tri-stack layer comprising $Al_2O_3$ and the third tri-stack layer comprising $Al_2O_3$ is about 3 Angstroms to about 10 Angstroms; and
wherein a thickness of the second tri-stack layer comprising $HfO_2$ is about 10 Angstroms to about 60 Angstroms.

9. A method to form a planar capacitor, comprising:
providing a first metal layer;
disposing a first tri-stack dielectric layer on a surface of the first metal layer;
disposing a second metal layer on a surface of the first tri-stack dielectric layer;
disposing a second tri-stack dielectric layer on a surface of the second metal layer; and
disposing a third metal layer on a surface of the second tri-stack dielectric layer,
wherein each of the first tri-stack dielectric layer and the second tri-stack dielectric layer comprises:
a first tri-stack layer comprising $Al_2O_3$;
a second tri-stack layer comprising $HfO_2$; and
a third tri-stack layer comprising $Al_2O_3$.

10. The method of claim 8,
wherein the second tri-stack layer comprising $HfO_2$ is disposed over the first tri-stack layer comprising $Al_2O_3$, and
wherein the third tri-stack layer comprising $Al_2O_3$ is disposed over the second tri-stack layer comprising $HfO_2$.

* * * * *